(12) United States Patent
Rupp et al.

(10) Patent No.: US 11,393,784 B2
(45) Date of Patent: Jul. 19, 2022

(54) SEMICONDUCTOR PACKAGE DEVICES AND METHOD FOR FORMING SEMICONDUCTOR PACKAGE DEVICES

(71) Applicant: Infineon Technologies AG, Neubiberg (DE)

(72) Inventors: Roland Rupp, Lauf (DE); Alexander Breymesser, Villach (AT); Andre Brockmeier, Villach (AT); Carsten von Koblinski, Villach (AT); Francisco Javier Santos Rodriguez, Villach (AT); Ronny Kern, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 15/690,517

(22) Filed: Aug. 30, 2017

(65) Prior Publication Data
US 2018/0068975 A1  Mar. 8, 2018

(30) Foreign Application Priority Data

Sep. 2, 2016   (DE) .......................... 102016116499.2

(51) Int. Cl.
*H01L 21/00* (2006.01)
*H01L 21/30* (2006.01)
(Continued)

(52) U.S. Cl.
CPC .......... *H01L 24/94* (2013.01); *H01L 21/4803* (2013.01); *H01L 21/561* (2013.01);
(Continued)

(58) Field of Classification Search
CPC . H01L 21/76224; H01L 23/562; H01L 21/78; H01L 27/14618; H01L 25/105;
(Continued)

(56) References Cited

U.S. PATENT DOCUMENTS 3,397,278 A * 8/1968 Pomerantz .............. C03C 27/02
156/273.1
4,437,228 A * 3/1984 Yamamoto .............. H01L 23/13
257/779

(Continued)

FOREIGN PATENT DOCUMENTS

CN  103681609 A  3/2014
DE  10153176 A1  3/2003

(Continued)

OTHER PUBLICATIONS

Coefficients of Thermal Expansion, The Engineering Toolbox, https://www.engineeringtoolbox.com/linear-expansion-coefficients-d_95.html, Jan. 14, 2019.*

(Continued)

*Primary Examiner* — Mary A Wilczewski
*Assistant Examiner* — Tsz K Chiu
(74) *Attorney, Agent, or Firm* — Murphy, Bilak & Homiller, PLLC

(57) ABSTRACT

A method for forming semiconductor devices includes attaching a glass structure to a wide band-gap semiconductor wafer having a plurality of semiconductor devices. The method further includes forming at least one pad structure electrically connected to at least one doping region of a semiconductor substrate of the wide band-gap semiconductor wafer, by forming electrically conductive material within at least one opening extending through the glass structure.

20 Claims, 12 Drawing Sheets

(51) Int. Cl.
  *H01L 21/46* (2006.01)
  *H01L 23/00* (2006.01)
  *H01L 21/56* (2006.01)
  *H01L 23/29* (2006.01)
  *H01L 21/48* (2006.01)
  *H01L 21/78* (2006.01)
  *H01L 23/31* (2006.01)
  *H01L 23/367* (2006.01)

(52) U.S. Cl.
  CPC ............ *H01L 21/78* (2013.01); *H01L 23/291* (2013.01); *H01L 23/3171* (2013.01); *H01L 23/367* (2013.01); *H01L 24/05* (2013.01); *H01L 24/83* (2013.01); *H01L 23/3114* (2013.01); *H01L 24/03* (2013.01); *H01L 2224/0332* (2013.01); *H01L 2224/03312* (2013.01); *H01L 2224/03462* (2013.01); *H01L 2224/0401* (2013.01); *H01L 2224/04042* (2013.01); *H01L 2224/05005* (2013.01); *H01L 2224/83893* (2013.01); *H01L 2224/83894* (2013.01); *H01L 2224/94* (2013.01); *H01L 2924/1033* (2013.01); *H01L 2924/10272* (2013.01); *H01L 2924/10329* (2013.01); *H01L 2924/12032* (2013.01); *H01L 2924/13091* (2013.01)

(58) Field of Classification Search
  CPC ... H01L 24/94; H01L 21/561; H01L 2224/94; H01L 23/15; H01L 2224/04042; H01L 2224/03462; H01L 25/065–0657
  See application file for complete search history.

(56) References Cited

U.S. PATENT DOCUMENTS

| | | | | |
|---|---|---|---|---|
| 5,992,725 A * | 11/1999 | Egawa | ................. | B23K 20/004 228/4.5 |
| 7,704,796 B2 * | 4/2010 | Pagaila | ................... | H01L 24/18 438/113 |
| 8,202,786 B2 * | 6/2012 | Von Koblinski | ........ | H01L 21/78 438/456 |
| 8,247,269 B1 * | 8/2012 | Liu | ......................... | H01L 24/97 438/107 |
| 8,865,522 B2 * | 10/2014 | von Koblinski | ........ | H01L 21/78 438/110 |
| 10,515,838 B2 * | 12/2019 | Uzoh | ............... | H01L 21/67144 |
| 10,714,462 B2 * | 7/2020 | Bhagavat | ......... | H01L 23/49827 |
| 2002/0001018 A1 * | 1/2002 | Katoh | ................. | B41J 2/14314 347/54 |
| 2002/0146200 A1 * | 10/2002 | Kudrle | ................. | B81B 3/0062 385/18 |
| 2003/0038328 A1 * | 2/2003 | Ishio | ..................... | G01L 9/0054 257/419 |
| 2003/0143776 A1 * | 7/2003 | Pedron, Jr. | ........ | H01L 23/49548 438/106 |
| 2004/0180517 A1 * | 9/2004 | Quenzer | ................ | C03B 19/02 438/479 |
| 2004/0182165 A1 * | 9/2004 | Miyashita | ........... | G01L 19/0084 73/718 |
| 2004/0184134 A1 * | 9/2004 | Makigaki | ............. | G02B 26/001 359/290 |
| 2004/0187588 A1 * | 9/2004 | Miyazawa | ........... | G01L 13/025 73/716 |
| 2005/0063071 A1 * | 3/2005 | Wang | ................... | G02B 5/1857 359/742 |
| 2005/0068627 A1 * | 3/2005 | Nakamura | .......... | G02B 26/001 359/578 |
| 2005/0072189 A1 * | 4/2005 | Tudryn | .................. | B81C 3/001 65/36 |
| 2005/0082651 A1 | 4/2005 | Farnworth et al. | | |
| 2005/0132648 A1 * | 6/2005 | Miyahara | ............ | B01J 19/0093 48/127.9 |
| 2005/0142812 A1 * | 6/2005 | Kurosawa | ............... | C03C 15/00 438/455 |
| 2005/0179732 A1 * | 8/2005 | Sato | ..................... | B41J 2/14233 347/54 |
| 2005/0218755 A1 * | 10/2005 | Song | ...................... | H03H 3/02 310/348 |
| 2005/0280975 A1 * | 12/2005 | Iwata | .................. | H01H 59/0009 361/160 |
| 2006/0008200 A1 * | 1/2006 | Nakamura | ........... | G02B 26/001 385/15 |
| 2006/0010964 A1 * | 1/2006 | Sparks | ................... | G01N 11/06 73/54.01 |
| 2006/0134825 A1 * | 6/2006 | DCamp | ................. | B81B 7/0038 438/106 |
| 2007/0177360 A1 * | 8/2007 | Shiraishi | ............... | B81B 7/0067 361/740 |
| 2008/0070340 A1 * | 3/2008 | Borrelli | ............. | H01L 27/14618 438/57 |
| 2010/0039030 A1 * | 2/2010 | Winters | .............. | H01L 27/3248 313/505 |
| 2010/0200061 A1 * | 8/2010 | Melchior | ................ | B29C 63/04 136/256 |
| 2011/0006403 A1 * | 1/2011 | Okumura | .......... | H01L 21/76224 257/620 |
| 2011/0053374 A1 * | 3/2011 | Kobayashi | ........ | H01L 21/30625 438/674 |
| 2011/0241214 A1 * | 10/2011 | Feng | ..................... | H01L 21/561 257/773 |
| 2012/0091551 A1 * | 4/2012 | Marenco | .......... | H01L 27/14625 257/432 |
| 2012/0104580 A1 * | 5/2012 | Feng | ................... | H01L 29/0657 257/673 |
| 2012/0248631 A1 * | 10/2012 | Von Koblinski | ........ | H01L 21/78 257/784 |
| 2013/0049205 A1 * | 2/2013 | Meyer | ..................... | H01L 24/96 257/773 |
| 2013/0126921 A1 * | 5/2013 | Mohammed | ........ | H01L 33/0079 257/98 |
| 2013/0147472 A1 * | 6/2013 | French | ................. | G01R 33/032 324/252 |
| 2013/0234297 A1 | 9/2013 | Breymesser et al. | | |
| 2013/0237034 A1 | 9/2013 | Breymesser et al. | | |
| 2013/0241040 A1 * | 9/2013 | Tojo | ................ | H01L 23/49844 257/666 |
| 2014/0021610 A1 | 1/2014 | von Koblinski et al. | | |
| 2014/0117530 A1 | 5/2014 | Breymesser et al. | | |
| 2014/0339694 A1 * | 11/2014 | von Koblinski | ...... | H01L 21/481 257/737 |
| 2014/0374831 A1 * | 12/2014 | Liaw | .................... | H01L 27/1104 257/368 |
| 2015/0237732 A1 * | 8/2015 | Velez | ..................... | H05K 1/182 361/763 |
| 2015/0246809 A1 | 9/2015 | Griessler et al. | | |
| 2015/0279930 A1 | 10/2015 | Schulze et al. | | |
| 2016/0035560 A1 * | 2/2016 | Schneegans | ........... | H01L 24/05 257/620 |
| 2016/0100489 A1 * | 4/2016 | Costa | ................... | H01F 27/24 361/764 |
| 2018/0026666 A1 * | 1/2018 | Yun | ..................... | H01L 21/4853 455/188.1 |
| 2018/0053730 A1 * | 2/2018 | Shao | ....................... | H01L 24/81 |

FOREIGN PATENT DOCUMENTS

| | | |
|---|---|---|
| DE | 102011051823 A1 | 4/2012 |
| DE | 102013110541 A1 | 3/2014 |
| DE | 102013111772 A1 | 4/2014 |
| JP | 2005327820 A * | 11/2005 |
| WO | 03030252 A2 | 4/2003 |

(56) References Cited

OTHER PUBLICATIONS

List of Thermal Expansion Coefficients, MSE Supplies, www.msesupplies.com/pages/list-of-thermal-expansion-coefficients-cte-for-natural-and-engineered-materials, Jan. 14, 2019.*

Rupp, Roland et al., "Avalanche Behaviour and its Temperature Dependence of Commercial SiC MPS Diodes: Influence of Design and Voltage Class", IEEE 26th International Symposium on Power Semiconductor Devices & IC's (ISPSD), Infineon Technologies, May 26, 2014, pp. 1-21.

Rupp, Roland et al., "Current distribution in the various functional areas of a 600V SiC MPS diode in forward operation", Materials Science Forum, vols. 717-720, May 2012, pp. 1-4.

* cited by examiner

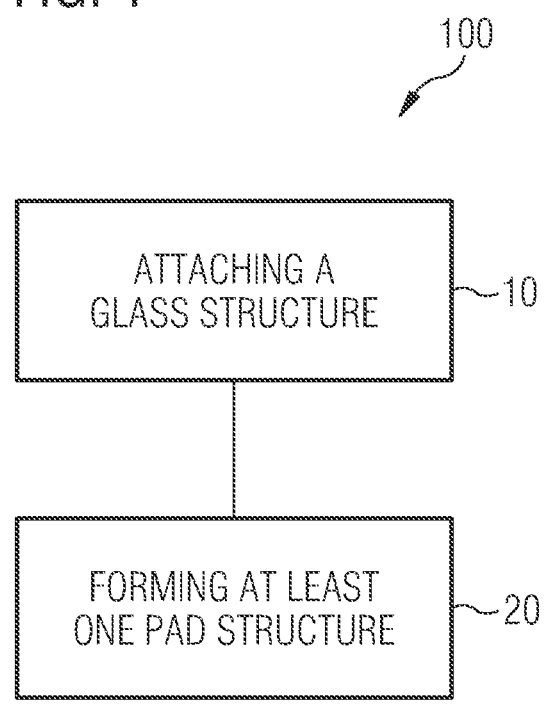

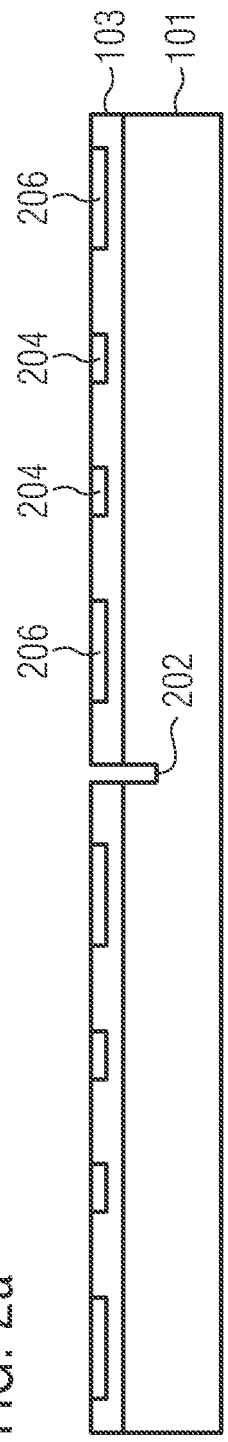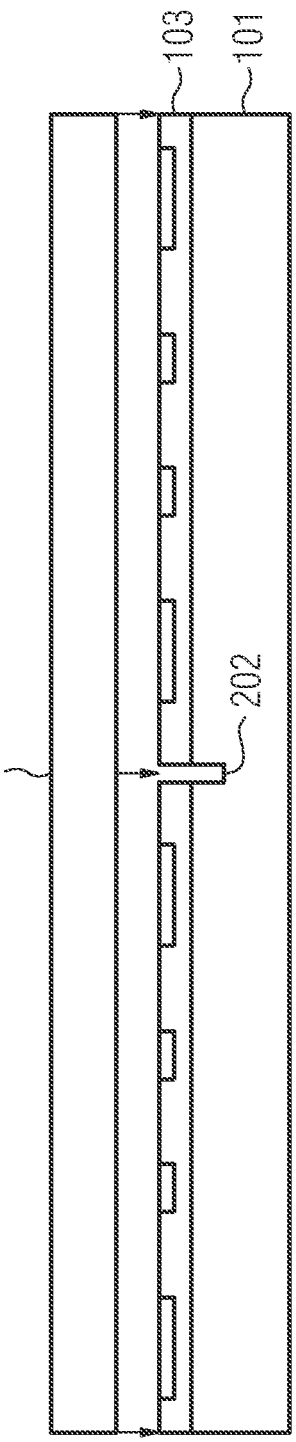

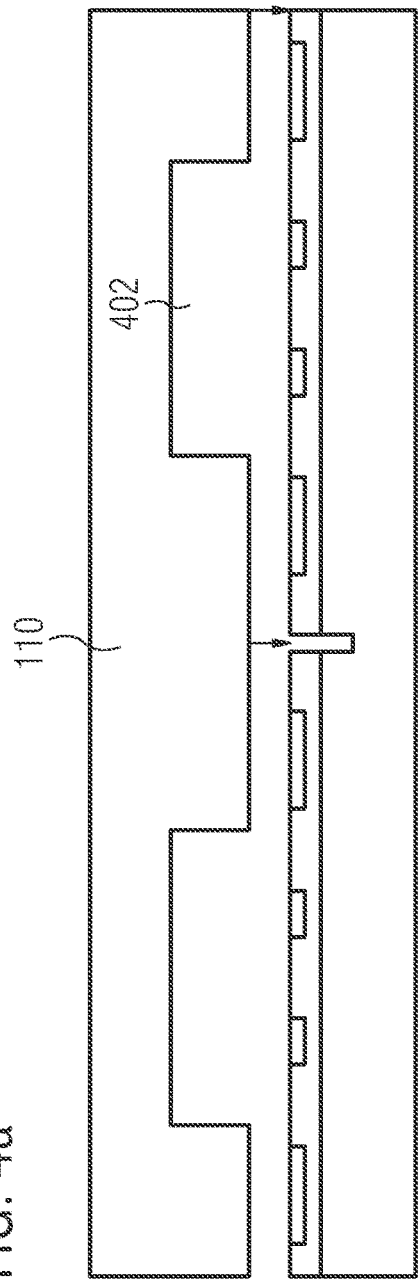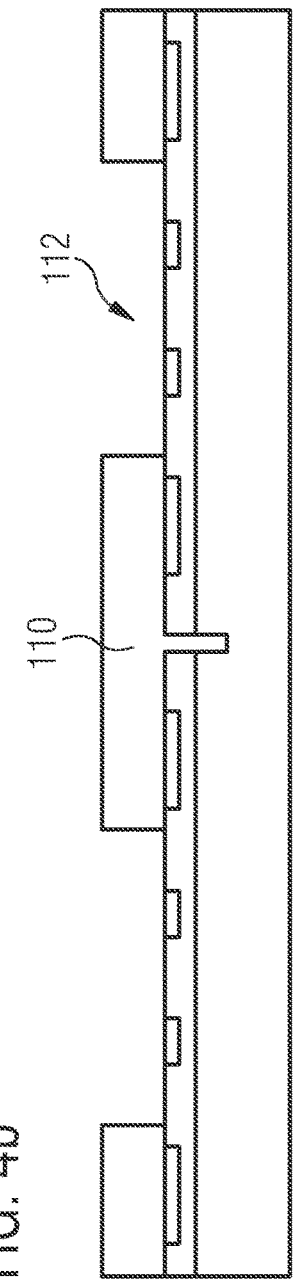

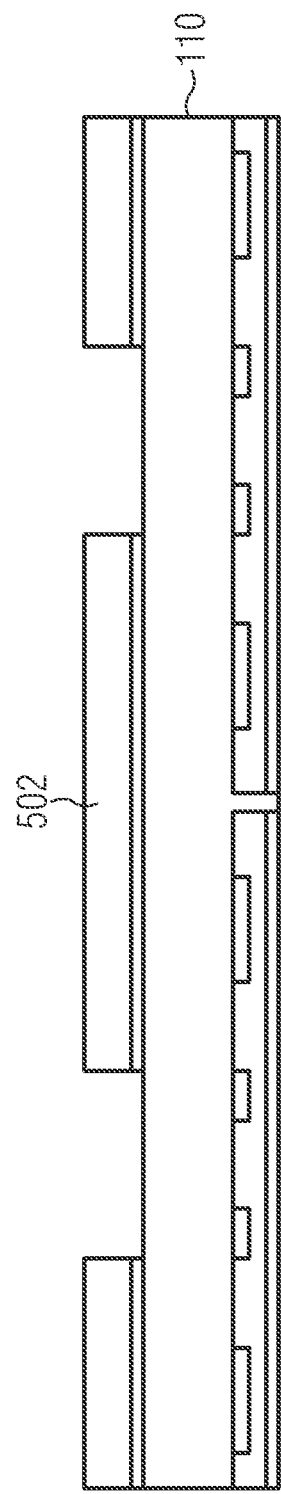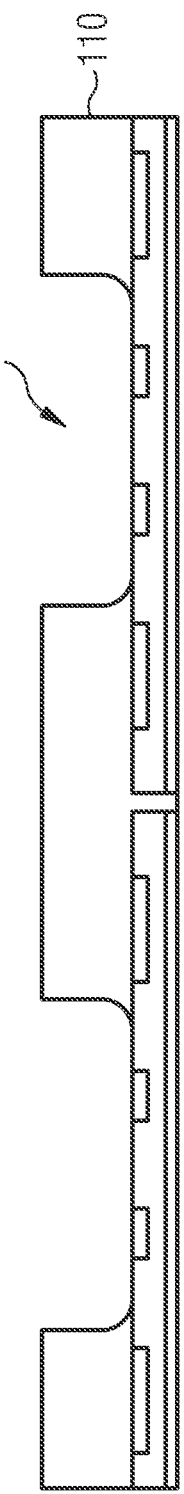

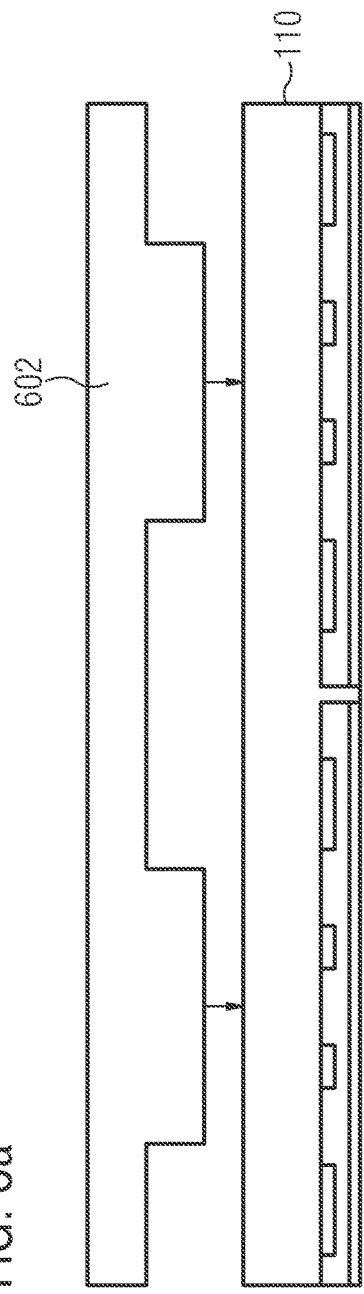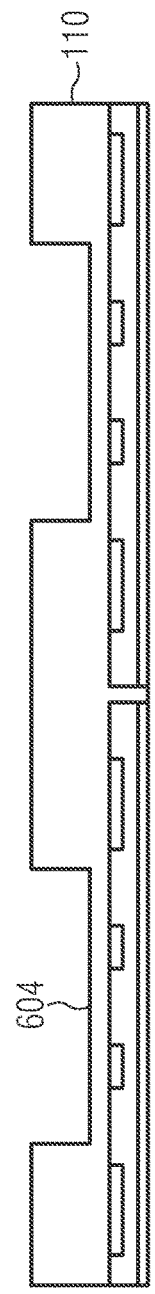

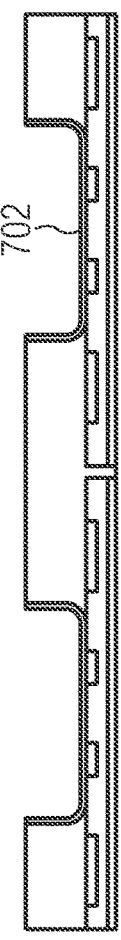
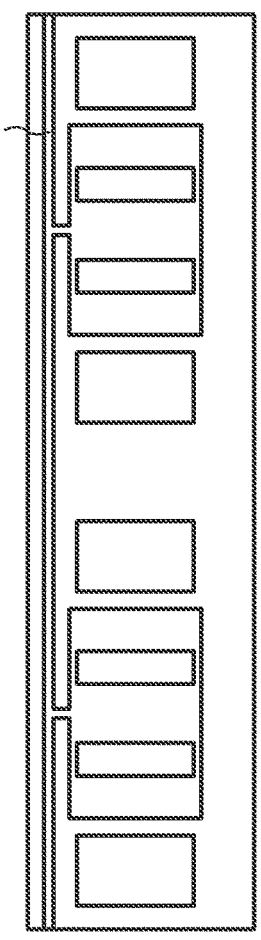
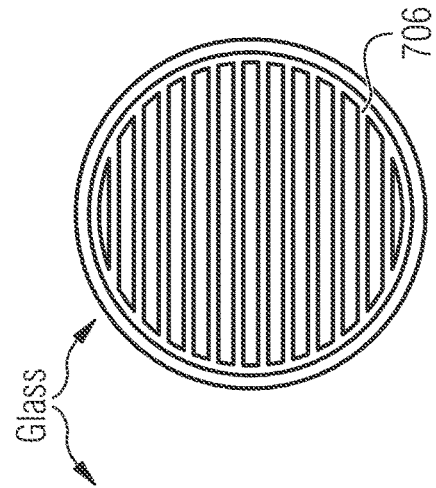
FIG. 7a
FIG. 7b
FIG. 7c
FIG. 7d

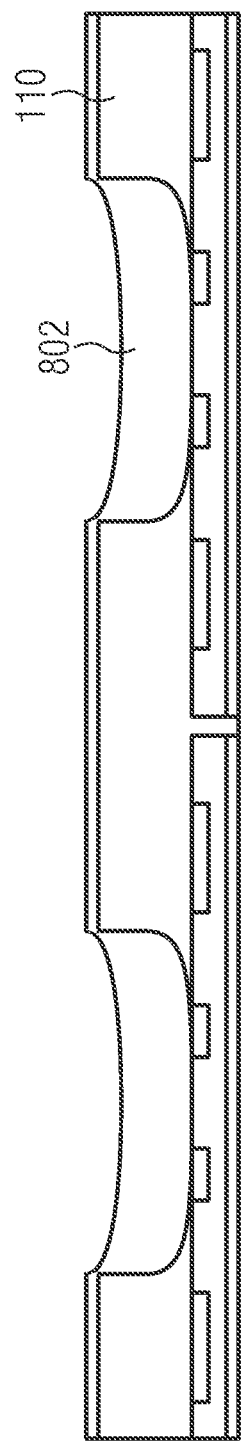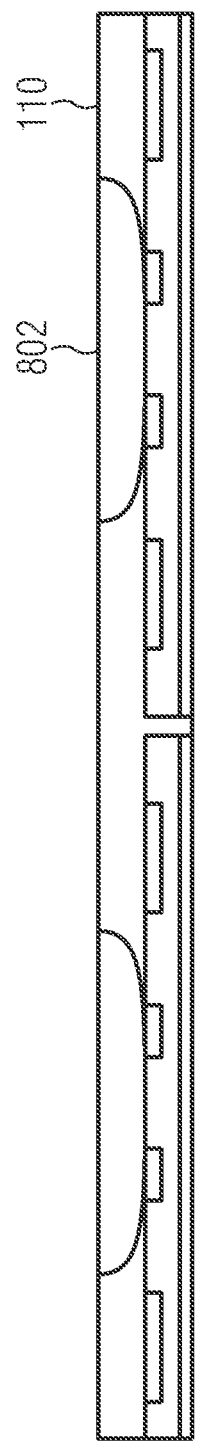

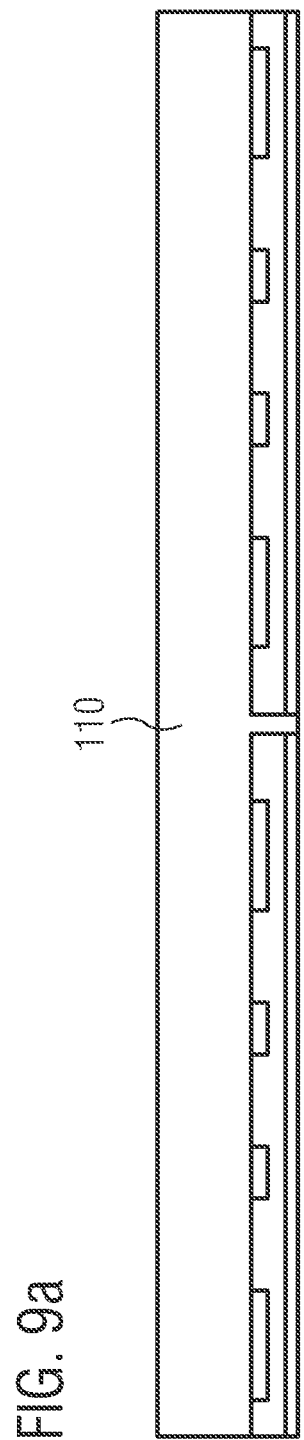

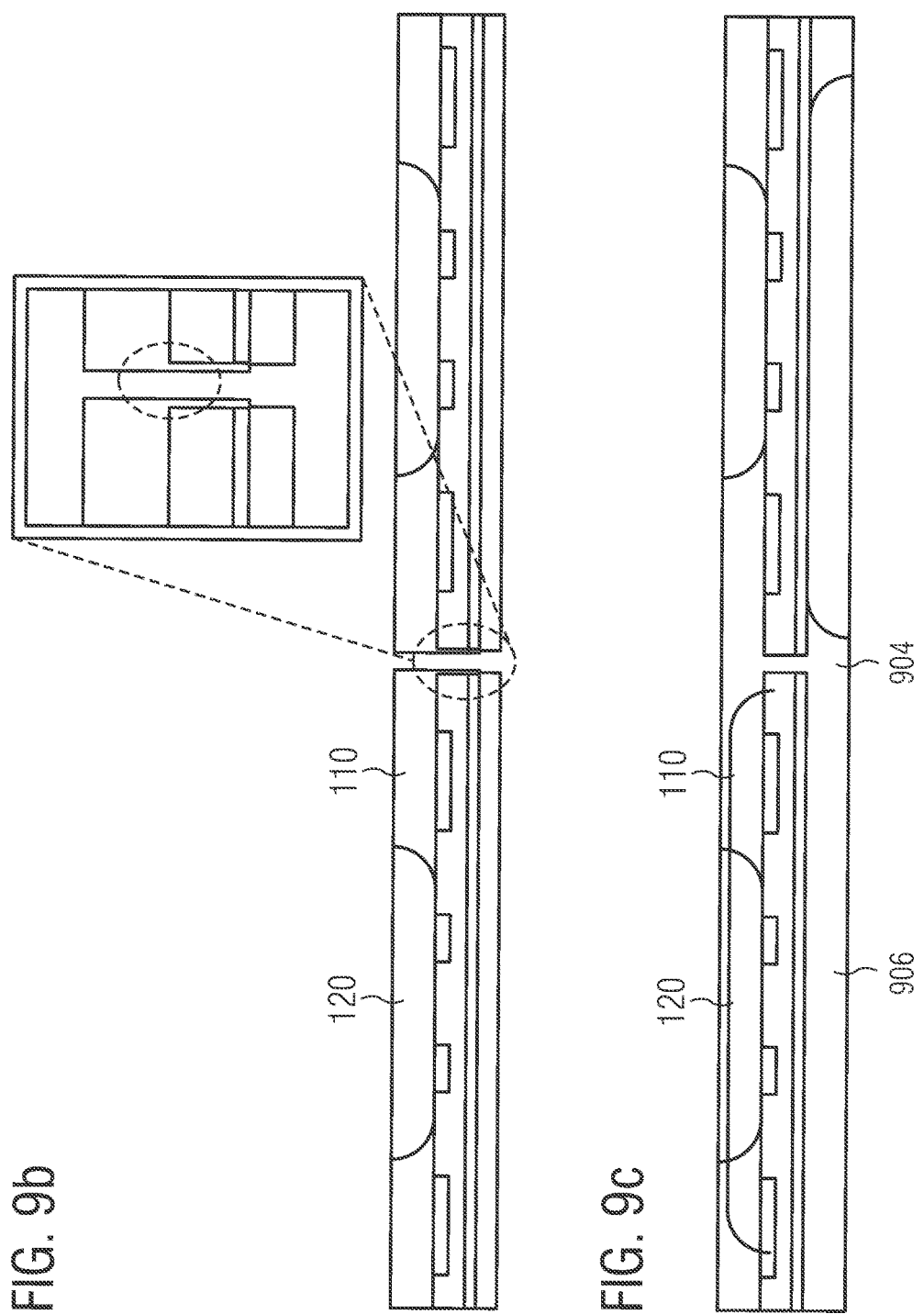

SEMICONDUCTOR PACKAGE DEVICES AND METHOD FOR FORMING SEMICONDUCTOR PACKAGE DEVICES

TECHNICAL FIELD

Embodiments relate to concepts for contact and passivation structures of semiconductor devices and in particular to a method for forming semiconductor devices and to semiconductor devices.

BACKGROUND

To protect the semiconductor devices or integrated circuits against the external environment in which they operate, they are typically accommodated in enclosed housings. Other concepts may rely on a hybrid package design, wherein at least two interfaces need to be realized. While the "chip housing" interface is often created directly at the chip manufacturer's site, often using sophisticated connection technologies such as wire bonding or flip-chip bonding, the second interface ("housing board/module") may often be realized at the end customer.

Non-hermetic, plastic-based or ceramic-based packages may be unsuitable for many applications in the semiconductor technology as they may be unable to adequately protect the electrical chip against external environmental influences (moisture, radiation, heat . . . ). Particularly due to the intensive moisture absorption, both imide-based chip passivations and packages of this type may show considerable disadvantages in (reflow) soldering (e.g., fracture or breakage formation as a result of the so-called popcorn effect), with regards to humidity uptake, and with regard to their long-term stability.

In addition, the capability of modern devices in operation may be particularly limited by the efficiency of heat dissipation as the increasing integration density and switching power result in increasingly larger surface-area related current densities and thus in increasingly larger thermal loads to which the devices are exposed. To protect the devices against a malfunction caused by overheating or even destruction, the user may increasingly take measures to cool the components.

Passive cooling concepts usually provide for the use of so-called "lead frames". Due to the increasing integration density of the devices and the related decreasing pitch distances, the production engineering effort and the requirements set for soldering pastes and screeners may increase. Alternatively, thick metal layers direct-on-chip (power metallization) for cooling may be used in some systems. However, the layer thicknesses of the metallization are in part limited to ~20 μm (e.g., in pattern plating).

SUMMARY

There may be a demand to provide an improved concept for semiconductor devices, which enables an improved contact structure and/or improved passivation and/or improved robustness of semiconductor devices.

Some embodiments relate to a method for forming semiconductor devices. The method comprises attaching a glass structure to a wide band-gap semiconductor wafer comprising a plurality of semiconductor devices. The method further comprises forming at least one pad structure electrically connected to at least one doping region of a semiconductor substrate of the wide band-gap semiconductor wafer by forming electrically conductive material within at least one opening extending through the glass structure.

Some embodiments relate to a semiconductor device comprising a wide band-gap semiconductor substrate. The semiconductor device further comprises a glass structure attached to the semiconductor substrate. The glass structure comprises at least one opening extending through the glass structure comprising at least one pad structure electrically connected to at least one doping region of the semiconductor substrate.

Some embodiments relate to a semiconductor device comprising a semiconductor substrate. The semiconductor device further comprises a glass structure attached to the semiconductor substrate. The glass structure comprises at least one opening extending through the glass structure comprising at least one pad structure electrically connected to at least one doping region of the semiconductor substrate. The glass structure is in contact with a vertical edge surface of the semiconductor substrate.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 1 illustrates a flow chart of a method for forming semiconductor devices;

FIGS. 2a-9c illustrate schematic cross sections of wide band-gap semiconductor wafers at various stages during manufacturing according to a method for forming semiconductor devices;

DETAILED DESCRIPTION

Figure 3A:
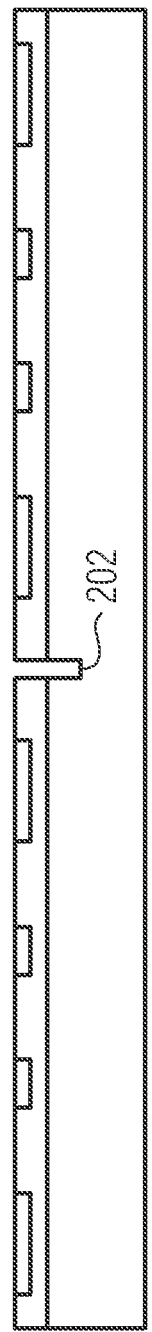

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

FIG. 1 illustrates a flow chart of a method 100 for forming semiconductor devices. The method comprises attaching 10 a glass structure to a wide band-gap semiconductor wafer comprising a plurality of semiconductor devices. The method further comprises forming 20 at least one pad structure electrically connected to at least one doping region of a semiconductor substrate of the wide band-gap semiconductor wafer by forming electrically conductive material within at least one opening extending through the glass structure.

Using a glass structure as passivation may enable to improve the protection of the semiconductor devices against external influences. Further, a thick power metallization or pad metallization may be enabled by using a glass structure with openings for pad structures. Additionally, the robustness of semiconductor devices in further processing or in the application may be improved by using a glass structure as passivation, since the glass structure may also implement a robust permanent carrier.

For example, the glass structure may comprise or may consist of at least one of a borosilicate glass, a soda-lime glass, a float glass, a quartz glass, a porcelain, a polymer thermoplastic, a polymer glass, an acrylic glass, polycarbonate, polyethylene terephthalate, an undoped silica, a doped silica, a polymer, a polynorbornene (polymer), polystyrene (polymer), a polycarbonate (polymer), a polyimide (polymer), a benzocyclobutene (polymer), and a parylene (polymer). For example, the glass structure may comprise a polymer exhibiting glass-like properties. The polymer may comprise a glass transition temperature, for example. For example, the glass structure may comprise a silica doped with at least one dopant. The at least one dopant may be one of boron (B), sodium (Na), calcium (Ca), potassium (K) and aluminum (Al), zinc (Zn), copper (Cu), magnesium (Mg), germanium (Ge), for example. For example, a coefficient of thermal expansion of the glass structure may differ by less than 30% (or less than 20%, less than 10% or less than 5% of a coefficient of thermal expansion of the wide band-gap semiconductor wafer) from the coefficient of thermal expansion of the wide band-gap semiconductor wafer. Using materials with similar coefficient of thermal expansion may reduce the mechanical stress within the semiconductor device.

For example, the glass structure may cover at least 40% (or at least 60%, at least 80% or the complete wafer) of a front-side surface of the wide band-gap semiconductor wafer. For example, a (e.g. average) thickness of the glass structure may be larger than 20 µm (or larger than 50 µm, larger than 100 µm, larger than 200 µm, larger than 400 µm, larger than 500 µm, larger than 750 µm, larger than 1 mm).

For example, the glass structure may implement a passivation of a front side of the wide band-gap semiconductor wafer. For example, semiconductor devices of the plurality of semiconductor devices may each comprise a semiconductor substrate being part of the wide band-gap semiconductor wafer. The glass structure may be in contact with a vertical edge surface of each of the semiconductor substrates of the semiconductor devices. The glass structure may be in contact with the vertical edge surface of the semiconductor substrates of the semiconductor devices over the whole thickness of the semiconductor substrates of the semiconductor devices, for example. The glass structure may implement a passivation of the vertical edge surface over the whole thickness of the semiconductor substrate, for example. For example, the method may comprise (further) thinning of the semiconductor substrates after the attaching of the glass structure, and the glass structure may implement a passivation of the vertical edge surface over the whole (remaining) thickness of the semiconductor substrate after thinning.

For example, the glass structure may be structured (e.g. masked etching or forming in a ductile state) before the attaching of the glass structure, e.g. to form the at least one opening, or the at least one opening may be formed after attaching of the glass structure to the wide band-gap semiconductor wafer.

For example, at least portions of the glass structure may be in direct contact with a (front-side) surface of the wide band-gap semiconductor wafer. Alternatively, the plurality of semiconductor devices may each comprise a wiring structure located in a wiring layer stack on the front-side surface of the wide band-gap semiconductor wafer. For example, the wiring structures are located between the wide band-gap semiconductor wafer and portions of the glass structure.

For example, the attaching 10 of the glass structure may comprise or may be implemented by anodic bonding of the (structured or unstructured) glass structure to the wide band-gap semiconductor wafer or hot embossing of the glass structure on the wide band-gap semiconductor wafer. For example, the attaching of the glass structure may irreversibly (permanently) connect the glass structure to a front side surface or a back side surface of the wide band-gap semiconductor wafer or a wiring layer stack of the wide band-gap semiconductor wafer located on the semiconductor substrate of the wide band-gap semiconductor wafer. The attaching of the glass structure may attach the glass structure to a front side or to a backside of the wide band-gap semiconductor wafer, for example. For example, the method may further comprise attaching a further glass structure to the other (front or back) side of the wide band-gap semiconductor wafer.

For example, the method 100 may further comprise forming at least one trench structure extending into the wide band-gap semiconductor wafer between neighboring semiconductor devices of the plurality of semiconductor devices. The trench structure, which may coincide with a kerf of a dicing process, may enable a side wall passivation of the semiconductor devices by the glass structure. For example, a portion of the glass structure may be pressed into the at least one trench during attaching 10 the glass structure to the wide band-gap semiconductor wafer. For example, the at least one trench structure may be a trench grid. The trench grid may at least partially separate or demarcate semiconductor substrates of semiconductor devices of the plurality of semiconductor devices. For example, the trench grid may comprise one or more rows of trenches and one or more columns of trenches. For example, a (average) width of the at least one trench structure (e.g. of trenches of a trench grid) may be larger than 10 µm (or larger than 20 µm, larger than 40 µm, larger than 100 µm). For example, a (average) width of the trenches of the at least one trench structure may be smaller than 500 µm (or smaller than 300 µm, smaller than 200 µm or smaller than 100 µm).

For example, the semiconductor devices of the plurality of semiconductor devices comprise each a semiconductor substrate being part of the semiconductor substrate of the wide band-gap semiconductor wafer and a glass sub-structure of the glass structure attached to the wide band-gap semiconductor wafer. For example, the method may further comprise dicing (e.g. sawing or laser cutting) the wide band-gap semiconductor wafer along the at least one trench structure to separate the plurality of semiconductor devices. The glass sub-structure may be in contact with a vertical surface of an edge of the semiconductor substrate (and e.g. implement a passivation of the vertical surface of the edge of the semiconductor substrate over the whole thickness of the glass structure) after cutting of the wide band-gap semiconductor wafer. For example, the glass sub-structure may correspond to a glass structure as described in connection with FIGS. 11 and 12.

For example, the at least one opening may comprise a lateral size larger than 2500 µm$^2$ (0.0025 mm$^2$, or larger than 0.01 mm$^2$, larger than 0.04 mm$^2$ or larger than 0.25 mm$^2$). For example, a lateral width of the at least one opening at a front-side surface of the at least one opening may differ by less than 10% (or less than 8%, less than 5%, less than 2% or less than 1%) of a lateral width of the at least one opening at a backside surface of the glass structure. Alternatively, a lateral width of the at least one opening may decrease by at least 5% (or at least 10%, at least 20%) between the front-side surface of the glass structure and the backside surface of the glass structure. For example, the front-side surface of the glass structure may be a surface of the glass structure facing away from the wide band-gap semiconductor wafer and the backside surface of the glass structure may be surface of the glass structure facing the wide band-gap semiconductor wafer.

For example, the method may further comprise forming the least one opening of the glass structure, e.g. after attaching of the glass structure, e.g. by etching of a portion of the glass structure, by grinding, by laser, by ultrasound hammering, by milling, by sand blasting or by sawing. The forming of the at least one opening may allow a usage of previously unstructured glass structures during the attachment of the glass structure.

For example, the electrically conductive material may comprise at least one of a metal (e.g. aluminum, copper, titanium, ruthenium and/or tungsten and or its nitride) and/or polysilicon. For example, the electrically conductive material may comprise an electrically conductive paste. For example, the forming of the electrically conductive material may comprise at least one of coating with the electrically conductive material, sputter deposition of the electrically conductive material, electrochemical deposition of the electrically conductive material or at least partially filling the at least one opening with electrically conductive paste. For example, the electrically conductive material of the at least one pad structure within the at least one opening may have a thickness larger than 20 µm (or larger than 50 µm, larger than 100 µm, larger than 200 µm, larger than 400 µm, larger than 500 µm). A thick pad structure may enable conducting large currents and/or improved heat transfer. The at least one pad structure may enable an electrical connection to an external electrical device (e.g. by a bond wire or a solder ball attached to the pad structure).

For example, a metallization of the contact pads (pad structures) may be performed on the front side. The electrically conductive material may comprise at least one of copper (Cu), AlCu (aluminum copper), Mo (molybdenum), AlSiCu (aluminum silicon copper), Ni (nickel), Au (gold) or Al (aluminum) or other metals/alloys. For example, the forming of the at least one pad structure may comprise forming a metal deposition to generate a Schottky contact (to the semiconductor substrate), e.g. using physical vapor deposition (PVD) (e.g. prior to power metallization). For this, metals such as Ti (titanium), Mo (molybdenum) or MoN (molybdenum nitride) may be suitable or other metals or alloys. Electroless plating methods may also be compatible (e.g., NiPPd (nickel phosphorous palladium plating), eNiG (electroless nickel immersion gold)).

For example, the at least one pad structure may comprise the electrically conductive material. For example, the at least one pad structure may comprise one or more pads, one or more wiring lines or connective layers. For example, the at least one pad structure may be (directly) connected to the doping region, e.g. contacted to the doping region. Alternatively, the at least one pad structure may be (electrically) connected to a wiring structure connected to the doping region. For example, each semiconductor device of the plurality of semiconductor devices may comprise a semiconductor substrate comprising a doping region and a pad structure connected to the doping region of the semiconductor substrate.

For example, the wide band-gap semiconductor wafer may comprise a wide band-gap semiconductor material. For example, the wide band-gap semiconductor wafer has a band gap larger than the band gap of silicon (1.1 eV). For example, the wide band-gap semiconductor wafer may be a silicon carbide (SiC)(-based) semiconductor wafer, or gallium arsenide (GaAs)-based semiconductor wafer, or a gallium nitride (GaN)-based semiconductor wafer. Using a silicon carbide-based wafer may entail improved thermal properties of the wide band-gap semiconductor wafer. For example, the wide band-gap semiconductor wafer may be patterned from a front side of the wide band-gap semiconductor wafer, e.g. by trench structures (e.g. pre-cut) located within a sawing frame (kerf) of the wide band-gap semiconductor wafer.

A thickness of an active layer of the wide band-gap semiconductor wafer (e.g. SiC wafer) may be larger than 4.5 µm (or larger than 10 µm, larger than 20 µm, larger than 50 µm) and/or smaller than 200 µm (or smaller than 100 µm, smaller than 50 µm), e.g. approximately 4.5 µm for a 650V device to approx. 100 µm for a 10 kV device. The active layer (e.g. epitaxy layer) of the wide band-gap semiconductor wafer may be a portion of the semiconductor substrate of the wide band-gap semiconductor wafer formed on a bulk portion of the semiconductor substrate of the wide band-gap semiconductor wafer. The active layer of the wide band-gap semiconductor wafer may be used to form electrical element structures (e.g. transistors or diodes), for example.

For example, the wide band-gap semiconductor wafer may comprise a plurality of semiconductor substrates for the plurality of semiconductor devices. For example, a semiconductor substrate may correspond to a portion of the wide band-gap semiconductor wafer. For example, each semiconductor device of the plurality of semiconductor devices may comprise a portion of the wide band-gap semiconductor wafer as semiconductor substrate of the semiconductor device. For example, each semiconductor device of the plurality of semiconductor devices may comprise at least one electrical element structure comprising a blocking voltage of more than 10V. For example, the electrical element structure may control and/or conduct and/or block a current flow between the front side of the semiconductor device and a backside of the semiconductor device. For example, the at least one electrical element structure may be a transistor structure or a diode structure. The semiconductor devices may be power semiconductor devices. A power semiconductor device and/or the at least one electrical element structure of the power semiconductor devices may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

For example, a vertical direction and a vertical dimension or thicknesses may be measured orthogonal to a front side surface of the wide band-gap semiconductor wafer and a lateral direction and lateral dimensions may be measured in parallel to the front side surface of the wide band-gap semiconductor wafer.

The front side of the wide band-gap semiconductor wafer may be the side used to implement more sophisticated and complex structures than at the backside of the wide band-gap semiconductor wafer, since the process parameters (e.g. temperature) and the handling may be limited for the backside, if structures are already formed at one side of the wide band-gap semiconductor wafer, for example.

For example, the method 100 may comprise additional processes for forming electrical element structures (e.g. forming doping regions, gate structures and/or wiring structures) before attaching 10 the glass structure to the wide band-gap semiconductor wafer.

FIGS. 2-9 show schematic cross sections of a part of a wide band-gap semiconductor wafer and a glass structure at different manufacturing stages according to various embodiments. FIGS. 2-9 illustrate exemplary processing steps of the method for forming semiconductor devices as described above (e.g. FIG. 1) or below. The following examples may be described in connection with the manufacturing of a vertical merged pn-Schottky diode, although other devices may be formed based on the described methods as well.

FIGS. 2a-2b illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with FIG. 1. FIGS. 2a-2b illustrate an attaching of a glass structure 110 on a wide band-gap semiconductor wafer comprising a plurality of semiconductor devices by hot embossing. FIG. 2a shows a schematic cross section of a part of the wide band-gap semiconductor wafer. The wide band-gap semiconductor wafer comprises a semiconductor substrate comprising a bulk portion 101 and an epitaxy layer 103 formed on the bulk portion 101. The bulk portion 101 may comprise a high n-doping and the epitaxy layer 103 may comprise a low n-base doping (e.g. before forming doping regions in the epitaxial layer). Further, highly p-doped anode regions 204 are formed at a front side surface of the semiconductor substrate of the wide band-gap semiconductor wafer for each semiconductor device. Additionally, low p-doped edge termination regions 206 are formed laterally between the highly p-doped anode regions 204 of the semiconductor devices and respective edges of the semiconductor substrate portions of the semiconductor devices.

FIG. 2b shows a schematic cross section of the wide band-gap semiconductor wafer and a glass structure 110 to be attached by hot embossing. Hot embossing may correspond to heating of the glass structure to a glass transition temperature and exerting pressure on at least a part of the glass structure.

The wide band-gap semiconductor wafer may correspond to a silicon carbide (SiC) wafer comprising an epitaxy layer (e.g. 20 µm thickness) and p−/p+ wells. For example, the glass structure 110 may comprise a thickness of 200 µm. The wide band-gap semiconductor wafer may comprise at least one trench structure 202, which may be filled by the glass structure 110 after hot embossing. The hot embossing may be performed in an environment comprising inert gas or vacuum. FIGS. 2a-2b may illustrate an example of a manufacturing of a glass/SiC composite system using a glass pressing technique (instead of inert gas, the actual bonding process may also take place under vacuum after an inert gas purge to avoid the formation of shrink holes/voids in the trenches). The trench structures may be generated using both photo-electrochemical, mechanical, plasma-supported and laser supported methods, for example.

Hot embossing may enable attaching the glass structure to non-planar semiconductor wafers, and may enable filling trenches extending into the wide band-gap semiconductor wafer with portions of the glass structure, e.g. to implement a passivation of a side wall of the semiconductor devices.

For example, the attaching of the glass structure 110 to the wide band-gap semiconductor wafer may comprise heating the glass structure 110 to a glass-transition temperature of the glass structure and exerting pressure on at least a part of the glass structure. For example, the heating of the glass structure may heat the glass structure 110 to at least 400° C. (or at least 500° C., at least 600° C., at least 700° C., at least 800° C., at least 900° C., at least 1000° C., at least 1100° C.). For example, the pressure may be exerted with an embossing stamp; the embossing stamp may have a uniform or patterned surface. The heating of the glass structure and exerting of pressure may be performed in a (pressure) chamber comprising an inert gas atmosphere or vacuum, for example.

For example, the exerting of the pressure on the glass structure may press at least portions of the glass structure into the at least one trench structure. For example, the embossing pattern may comprise at least one elevation corresponding to the at least one trench structure.

The at least one trench structure may comprise a plurality of trenches, for example. The plurality of trenches may be stripe-shaped (e.g. pillar-shaped or column-shaped in a cross section). A stripe-shape may be a geometry extending in a first lateral direction significantly farther than in an orthogonal second lateral direction. For example, the plurality of trenches may comprise a lateral length of more than 10× (or more than 50× or more than 100×) a lateral width of trenches of the plurality of trenches. For example, the lateral length of a trench of the plurality of trenches may be the largest lateral extension of the plurality of trenches. For example, the plurality of trenches may comprise a vertical extension larger than the lateral width and shorter than the lateral length. For example, the at least one trench structure may extend into a depth of more than 10 µm (or more than 30 µm or more than 50 µm). For example, the at least one trench structure may extend into a backside metallization of the wide band-gap semiconductor wafer.

More details and aspects of the method are mentioned in connection with the proposed concept or one or more examples described above or below (e.g. FIGS. 1, 3-12). The method may comprise one or more additional optional features corresponding to one or more aspects of the proposed concept or one or more examples described above or below.

Figure 3B:
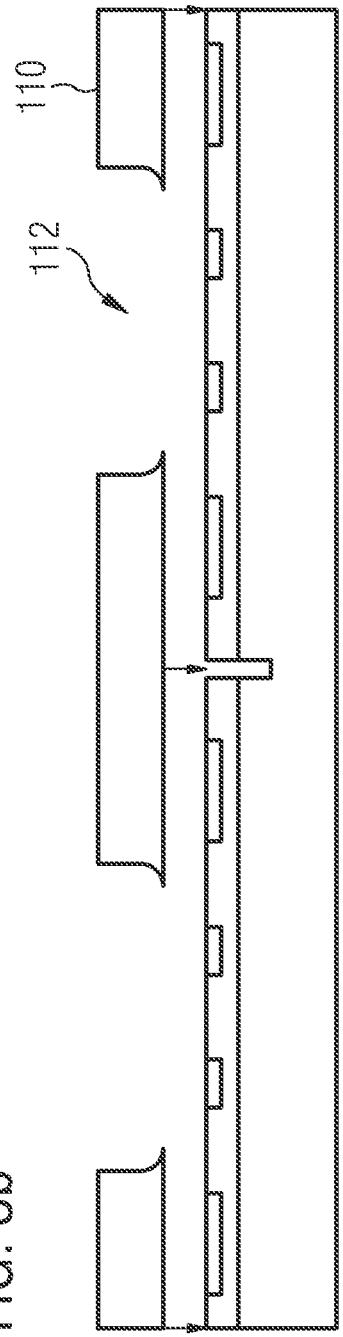

FIGS. 3a-3b illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-2. FIGS. 3a-3b illustrate attaching of a glass structure 110 on a wide band-gap semiconductor wafer comprising a plurality of semiconductor devices by anodic bonding. FIG. 3a shows a schematic cross section of the wide band-gap semiconductor wafer before attaching of the glass structure, FIG. 3b shows a schematic cross section of the wide band-gap semiconductor wafer after the attaching of the glass structure. FIG. 3 may illustrates manufacturing of a glass/SiC composite system using an anodic bonding method. The glass structure 110 may be pre-structured for example. The wide band-gap semiconductor wafer may comprise at least one trench structure 202, for example.

For example, the attaching of the glass structure 110 may comprise anodic bonding of the glass structure 110 to the wide band-gap semiconductor wafer. The anodic bonding may enable an attachment of the glass structure to the wide band-gap semiconductor wafer, and may allow an attachment of pre-structured glass structures. For example, the anodic bonding may comprise applying a high voltage (e.g. more than 500V) between a cathode located on a front side of the glass structure and wafer carrier structure holding the wide band-gap semiconductor wafer. For example, sodium ions of the glass structure may migrate towards the cathode, leaving behind fixed negative charges creating an electrical field between the wide band-gap semiconductor wafer and the glass structure, holding the glass structure and the wide band-gap semiconductor wafer together. For example, the front side surface of the wide band-gap semiconductor wafer may be planar. For example, the semiconductor devices might not comprise wiring structures located on the front side surface of the wide band-gap semiconductor wafer. For example, the anodic bonding may comprise heating of the glass structure and/or of the wide band-gap semiconductor wafer to between 350° C. and 450° C. For example the front side surface of the semiconductor substrate may comprise silicon (Si) or polysilicon. The anodic bonding may further comprise exerting pressure on at least a part of the glass structure.

For example, the glass structure 110 may comprise at least one opening 112 before attaching of the glass structure to the wide band-gap semiconductor wafer. For example, the glass structure 110 may be (pre-) structured. For example, the method may comprise forming the at least one opening before the attaching of the glass structure to the wide band-gap semiconductor wafer.

More details and aspects of the method are mentioned in connection with the proposed concept or one or more examples described above or below (e.g. FIGS. 1-2, 4-12). The method may comprise one or more additional optional features corresponding to one or more aspects of the proposed concept or one or more examples described above or below.

FIGS. 4a-4b illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-3. FIGS. 4a-4b illustrate attaching of a glass structure 110 on a wide band-gap semiconductor wafer comprising a plurality of semiconductor devices by anodic bonding (FIG. 4a) and forming of at least one opening 112 by grinding of a portion of the glass structure 110 to expose a recess 402 of the glass structure (FIG. 4b). FIGS. 4a-4b may illustrate a manufacturing of a glass/SiC composite system using a pre-embossed glass substrate and an anodic bonding method.

For example, the forming of the at least one opening 112 may comprise grinding of a portion of the glass structure 110 to expose at least one recess in the glass structure to form the at least one opening 112. This may enable a usage of glass structures with a pre-structured recess. For example, the glass structure 110 may comprise the at least one recess during attaching of the glass structure 110 to the wide band-gap semiconductor wafer. For example, the at least one recess may extend from a backside of the glass structure into the glass structure. For example, the attaching 10 of the glass structure 110 may comprise anodic bonding of the glass structure 110 to the wide band-gap semiconductor wafer. For example, the glass structure may comprise an upper portion and a lower portion. The lower portion of the glass structure may comprise the at least one recess. For example, the grinding of the portion of the glass structure 110 may comprise removing the upper portion of the glass structure. For example, the forming of the at least one opening 112 may further comprise forming the at least one recess in the glass structure, e.g. by heating of the glass structure to a glass transition temperature and exerting pressure of at least a part of the glass structure using an embossing pattern.

More details and aspects of the method are mentioned in connection with the proposed concept or one or more examples described above or below (e.g. FIGS. 1-3, 5-12). The method may comprise one or more additional optional features corresponding to one or more aspects of the proposed concept or one or more examples described above or below.

FIGS. 5a-5b illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-4. FIGS. 5a-5b illustrate a forming of at least one opening 112 of a glass structure 110 attached to a wide band-gap semiconductor wafer by etching of at least a portion of the glass structure. The etching of the at least portion may enable the forming of the opening, e.g. by removing portions of the glass structure remaining after previous processing. FIG. 5a shows a schematic cross section of the wide band-gap semiconductor wafer and the attached glass structure after depositing of at least one masking layer 502 (e.g. a polysilicon layer and a photoresist layer) and structuring of the at least one masking layer 502. A subsequent etching of the glass structure may form the at least one opening 112, for example (FIG. 5*b*). FIGS. 5*a*-5*b* may illustrate a wet-chemical glass structuring using poly Si and photoresist.

For example, the forming of the at least one opening 112 may comprise etching of at least a portion of the glass structure to obtain at least a portion of the at least one opening. For example, the etching of at least the portion of the glass structure may comprise removing a portion of the glass structure to obtain at least the portion of the at least one opening. For example, the etching of at least the portion may comprise isotropic etching or anisotropic etching of the at least portion of the glass structure. The etching may comprise wet etching, plasma etching or etching based on a mask-less structuring, e.g. based on photo-patternable glass. The etching of the at least portion of the glass structure may etch a front side surface of the glass structure, for example.

For example, the forming of the at least one opening 112 may comprise forming of at least one masking layer (e.g. a photoresist and a polysilicon layer) on the glass structure and structuring of the at least one masking layer. The etching of the at least portion of the glass structure may be based on the at least one masking layer. For example, the etching of the glass structure may etch portions of the glass structure 110 exposed by the at least one masking layer. For example, the etching of the glass structure may etch portions of the glass structure 110 adjacent to portions of the glass structure exposed by the at least one masking layer. The opening of the (poly silicon) masking layer may be realized using plasma-supported etching methods, the glass structure may be subject to wet-chemical etching with hydrofluoric acid (HF) based chemistry (immersion etching or spray etching), for example.

More details and aspects of the method are mentioned in connection with the proposed concept or one or more examples described above or below (e.g. FIGS. 1-4, 6-12). The method may comprise one or more additional optional features corresponding to one or more aspects of the proposed concept or one or more examples described above or below.

FIGS. 6*a*-6*c* illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-5. FIGS. 6*a*-6*c* illustrate forming of at least one opening 112 of a glass structure 110 attached to a semiconductor wafer by hot embossing with an embossing pattern 602. FIGS. 6*a*-6*c* illustrate an (alternative) glass structuring using hot embossing.

FIG. 6*a* illustrates the forming of at least one opening 112 of a glass structure 110 attached to a wide band-gap semiconductor wafer by (repeatedly) heating the glass structure to a glass transition temperature (e.g. close to a temperature, where the glass structure flows) and exerting pressure on at least a part of the glass structure 110 with a embossing pattern 602 (hot embossing). After the hot embossing (FIG. 6*b*), a recessed portion 604 of the glass structure may cover the wide band-gap semiconductor wafer at a location dedicated for the at least one opening 112. A subsequent etching (e.g. wet chemical etching) of at least a portion of the glass structure may remove the recessed portion 604 of the glass structure to form the at least one opening 112 (FIG. 6*c*).

For example, the forming of the at least one opening 112 may comprise heating the glass structure 110 to a glass-transition temperature of the glass structure and exerting pressure on at least a part of the glass structure with an embossing pattern. For example, the embossing pattern may comprise at least one elevated portion corresponding to the at least one opening. For example, the exertion of pressure with the embossing pattern on the glass structure may form the glass structure to mimic the embossing pattern. For example, the heating of the glass structure may heat the glass structure 110 to at least 400° C. (or at least 500° C., at least 600° C., at least 700° C., at least 800° C., at least 900° C., at least 1000° C., at least 1100° C.).

More details and aspects of the method are mentioned in connection with the proposed concept or one or more examples described above or below (e.g. FIGS. 1-5, 7-12). The method may comprise one or more additional optional features corresponding to one or more aspects of the proposed concept or one or more examples described above or below.

FIG. 7*a*-7*d* illustrate a part of a wide band-gap semiconductor wafer at various manufacturing stages of method for forming of a plurality of semiconductor devices. FIGS. 7*a* and 7*b* illustrate schematic cross sections of the part of the wide band-gap semiconductor wafer and FIGS. 7*c* and 7*d* illustrate schematic top views of the part of the wide band-gap semiconductor wafer or of the wide band-gap semiconductor wafer. The forming of the semiconductor devices may be implemented similar to a method or aspects shown in connection with one of the FIGS. 1-6. FIG. 7*a* shows a glass structure 110 attached to a wide band-gap semiconductor wafer. The glass structure 110 comprises at least one opening comprising a seed layer 702. After electrochemical deposition (ECD), the at least one opening may be filled by electrically conductive material 704 (FIG. 7*b*). FIG. 7*c* shows a top view of the part of the wide band-gap semiconductor wafer. FIGS. 7*a*-7*d* illustrate a contact metallization (ECD option).

For example, the plurality of semiconductor devices may comprise a plurality of pad structures electrically connected to a plurality of doping regions of a plurality of semiconductor substrates of the plurality of semiconductor devices. The forming of the electrically conductive material may comprise forming of an electrical connection between the plurality of pad structures. The plurality of pad structures may be formed by forming the electrically conductive material within a plurality of openings of the glass structure. The electrical connection may enable an electrochemical deposition of electrically conductive material, for example. An exemplary electrical connection between the plurality of pad structures is shown in FIGS. 7*c* and 7*d* 706. For example, the electrical connection may comprise a wiring structure at least partially located on the glass structure or within a trench structure extending into the glass structure from a front side of the glass structure. For example, the forming of the electrical connection between the plurality of pad structures may comprise forming of a trench structure for the electrical connection between the plurality of pad structures. For example, the forming of the electrical connection may comprise forming of a seed layer for an electrochemical deposition of the electrically conductive material for the plurality of pad structures. Alternatively, the forming of the electrically conductive material may further comprise forming of the seed layer (e.g. seed layer 702) after the forming of the electrical connection. The removing of at least a portion of the seed layer may further comprise grinding or polishing of at least a portion of the glass structure. The forming of the electrically conductive material may further comprise electrochemical deposition of the electrically conductive material 704 on the seed layer. For example, the seed layer may correspond to a Schottky-metallization located on the wide band-gap semiconductor wafer.

For example, the forming of the electrically conductive material may further comprise removing (e.g. by polishing or grinding) of a portion of the seed layer after depositing of the seed layer (and before ECD). For example, the removing of the portion of the seed layer may remove a portion of the seed layer extending further from the wide band-gap semiconductor wafer than the glass structure 110. The forming of the seed layer may further comprise removing at least a portion of the seed layer located on a front side surface of the glass structure (e.g. a portion of the seed layer not located within the at least one opening or located within a trench structure extending into the glass structure), e.g. before electrochemical deposition.

For example, the forming of the electrically conductive material may further comprise electrically disconnecting the plurality of pad structures after the forming of the plurality of pad structures, e.g. after the electrochemical deposition of the electrically conductive material on the seed layer, which may avoid shorts during usage of the semiconductor devices. For example, the removing of the at least one electrical connection may comprise cutting within the trenches used for the electrical connection between the plurality of pad structures or grinding or polishing away of at least a part of the electrical connection between the plurality of pad structures. For example, at least portions of the electrical connection between the plurality of pad structures may be located within a trench structure extending into the glass structure (e.g. from a front side of the glass structure). The method may further comprise grinding of a portion of the glass structure 110 to electrically disconnect the plurality of pad structures. If the trench structure is located further away from the surface of the wide band-gap semiconductor wafer than a target thickness of the glass structure, the electrical connection can (easily) be removed. For example, the grinding of the portion of the glass structure may grind away a portion of the glass structure and of the electrical connection between the plurality of pad structures extending (vertically) further from the wide band-gap semiconductor wafer than a bottom of the trench structure. For example, the bottom of the trench structure may be located at least 100 μm (or at least 200 μm, at least 300 μm, at least 400 μm) above (e.g. substantially parallel to the wide band-gap semiconductor wafer with a vertical distance of at least 100 μm) a front side surface of the wide band-gap semiconductor wafer.

More details and aspects of the method are mentioned in connection with the proposed concept or one or more examples described above or below (e.g. FIGS. 1-6, 8-12). The method may comprise one or more additional optional features corresponding to one or more aspects of the proposed concept or one or more examples described above or below.

FIGS. 8a-8b illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-7. FIGS. 8a-8b illustrate a forming of an electrically conductive material 802. For example, the forming of the electrically conductive material may comprise at least partially filling the at least one opening with an electrically conductive paste, which may enable backfilling of large openings. For example, the electrically conductive paste may comprise aluminum (Al), silver (Ag), gold (Au) and/or copper (Cu). For example, the method may comprise printing of the electrically conductive paste. FIG. 8a shows an embodiment of a glass structure 110 attached to a wide band-gap semiconductor wafer after a filling of the at least one opening with the at least one electrically conductive paste. For example, the method may further comprise grinding of a portion of the glass structure 110 and of a portion of the electrically conductive paste 802 (as shown in FIG. 8b). For example, the grinding of the portion of the glass structure and of the portion of the electrically conductive paste may remove a portion of the electrically conductive paste deposited on the glass structure outside the at least one opening. FIG. 8a-8b illustrate a contact metallization (screen printing option) and a planarization of the composite system.

For example, a backfilling of large contact areas may be performed using screen printing of relevant metal pastes. For example, the electrically conductive paste may be drawn across the at least one opening (relevant opening) in the glass using a squeegee. Excess material may be removed. Here, the structured glass (the glass structure comprising the at least one opening) may act as a mask/screen.

More details and aspects of the method are mentioned in connection with the proposed concept or one or more examples described above or below (e.g. FIGS. 1-7, 9-12). The method may comprise one or more additional optional features corresponding to one or more aspects of the proposed concept or one or more examples described above or below.

FIGS. 9a-9c illustrate schematic cross sections of a part of a wide band-gap semiconductor wafer at various manufacturing stages of a method for forming of a plurality of semiconductor devices according to an embodiment. The forming of the semiconductor devices may be implemented similar to a method or aspects shown in connection with one of the FIGS. 1-8. FIGS. 9a and 9b show a schematic cross section of a wide band-gap semiconductor wafer and of an attached glass structure 110 before and after separating the wide band-gap semiconductor wafer to obtain a plurality of semiconductor devices. FIG. 9a may further show thinning of a SiC substrate (wide band-gap semiconductor wafer). For example, the method may further comprise separating the plurality of semiconductor devices by cutting only through electrically insulating material. For example, the cutting might cut only through one or more glass structures, e.g. through the glass structure 110 and/or a further glass structure 904. For example, the cutting might not cut through the wide band-gap semiconductor wafer or might not cut through a backside metallization of the wide band-gap semiconductor wafer. This may facilitate separating the plurality of semiconductor devices. For example, the cutting may cut the wide band-gap semiconductor wafer and the one or more glass structures along a trench structure extending into the wide band-gap semiconductor wafer from a front side of the wide band-gap semiconductor wafer. For example, separating the plurality of semiconductor devices may comprise (partial) grinding of a backside of the wide band-gap semiconductor wafer. Alternatively, separating the plurality of semiconductor devices (e.g. by structuring a backside metallization) may comprise using a lithography and an etching process (e.g. wet, plasma, or a combination of them), so that, in a subsequent separation process, (only) glass may need to be sawed through, for example. For example, the glass structure may comprise at least one further opening located along a trench structure extending into the wide band-gap semiconductor wafer from a front side of the wide band-gap semiconductor wafer. The grinding of the backside metallization may separate the plurality of semiconductor devices at the at least one further opening. FIG. 9b shows a backside metallization and separation of the compound system. FIG. 9b further shows at least one pad structure 120.

FIG. 9c shows a schematic cross section of a wide band-gap semiconductor wafer and an attached glass structure 110 after attaching of a further glass structure 904. For example, the method comprising attaching a further glass structure to a backside of the wide band-gap semiconductor wafer and forming at least one electrically conductive structure 906 electrically connected to a backside of the semiconductor substrate by forming electrically conductive material within at least one opening extending through the further glass structure. The further glass structure may allow for a thick backside metallization. The forming of the further glass structure may be implemented similar to a forming of the glass structure 110 as described in connection with FIGS. 1-8. The forming of the electrically conductive structure may be implemented similar to a forming of at least one pad structure as described in connection with FIGS. 1-8. For example, the forming of the electrically conductive structure may comprise forming of a plurality of electrically conductive structures for the plurality of semiconductor devices. The plurality of electrically conductive structures may correspond to a plurality of backside metallizations of the plurality of semiconductor devices. For example, the at least one electrically conductive structure may comprise a thickness larger than 5 µm (or larger than 10 µm, larger than 20 µm, larger than 50 µm, larger than 100 µm, larger than 200 µm, larger than 400 µm). For example, thick power metal may be connected to the front side and to the backside of the wide band-gap semiconductor wafer. FIG. 9c illustrates a thick power metallization as an option for the backside.

Structuring the backside metallization (electrically conductive structure) using a lithography and an etching process (wet, plasma or a combination of them) may be performed so that, in the subsequent separation process, only glass may need to be sawed through. Chipping-free devices may thus be realized.

More details and aspects of the method are mentioned in connection with the proposed concept or one or more examples described above or below (e.g. FIGS. 1-8, 10-12). The method may comprise one or more additional optional features corresponding to one or more aspects of the proposed concept or one or more examples described above or below.

Figure 10:
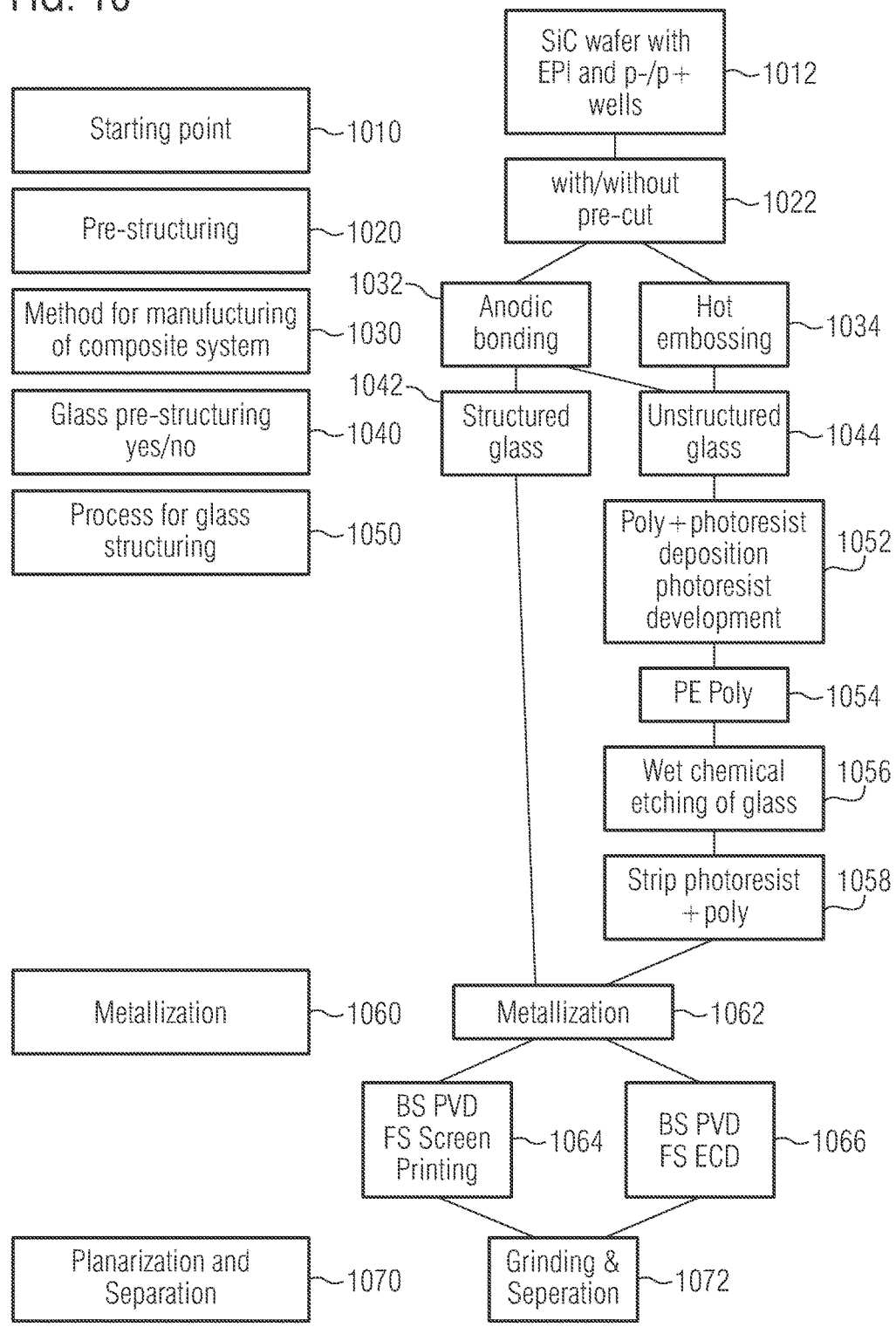
FIG. 10 illustrates a flow chart of a method for forming semiconductor devices.

FIG. 10 shows a flow chart of a method for forming semiconductor devices. The method may be implemented similar to a method described in connection with FIGS. 1-9. FIG. 10 shows a schematic of two process variants in a summary.

A starting point 1010 of the method may be a silicon carbide (SiC) wafer with epitaxy and p−/p+ wells 1012. The method may comprise a distinction regarding a pre-structuring 1020 of the SiC wafer. For example, the SiC wafer may be pre-cut or not 1022. The method may further comprise a method for a manufacturing of a composite system 1030 (of the SiC wafer and a glass structure). The method may comprise anodic bonding 1032 or hot embossing 1034. The method may further comprise a distinction 1040 between a pre-structured glass structure 1042? and an unstructured glass structure 1044. The method may further comprise a process for glass structuring 1050. If the glass is unstructured, the process may comprise a polysilicon and photoresist deposition and a development of the photoresist 1052 (e.g. similar to a forming of at least one masking layer as described in connection with FIGS. 5a-5b), a plasma etching of the polysilicon 1054, a wet chemical etching (e.g. hydrofluoric etching) of the glass structure 1056 and a stripping of the photoresist and the polysilicon 1058. The method may further comprise a metallization 1060 (in case of structured or unstructured glass), comprising metallization 1062 and either backside physical vapor deposition and front side screen printing 1064 (or an electrically conductive material) or backside physical vapor deposition and a front side electrochemical deposition 1066. The method may further comprise planarization and separation 1070, e.g. grinding and separation 1072. If a further glass structure is attached to the backside of the wide band-gap semiconductor wafer, for backside metallization, electrochemical deposition and (screen) printing may be applied, for example.

More details and aspects of the method are mentioned in connection with the proposed concept or one or more examples described above or below (e.g. FIGS. 1-9, 11-12). The method may comprise one or more additional optional features corresponding to one or more aspects of the proposed concept or one or more examples described above or below.

Figure 11:
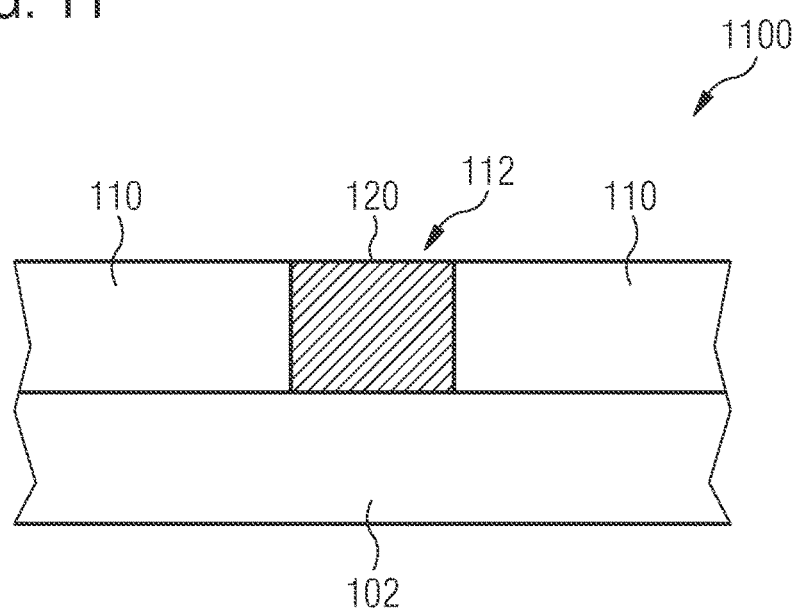
FIG. 11 illustrates a schematic cross section of a semiconductor device.

FIG. 11 illustrates a schematic cross section of a semiconductor device 1100 comprising a wide band-gap semiconductor substrate 102. The semiconductor device 1100 further comprises a glass structure 110 attached to the semiconductor substrate 102. The glass structure comprises at least one opening 112 extending through the glass structure comprising at least one pad structure 120 electrically connected to at least one doping region of the semiconductor substrate 102.

Using a glass structure as passivation may enable to improve the protection of the semiconductor devices against external influences. Further, a thick power metallization or pad metallization may be enabled by using a glass structure with openings for pad structures. Additionally, the robustness of semiconductor devices may be improved by using a glass structure as passivation, since the glass structure may also implement a robust carrier.

For example, the glass structure 110 may cover a front side of the semiconductor substrate except for the at least one opening 112. For example, the glass structure 110 may be attached to the semiconductor substrate 102 by an anodic bond. For example, the glass substrate 110 may be embossed on the semiconductor substrate 102. For example, the glass structure 110 may be in contact with a vertical edge surface of the semiconductor substrate and implements a passivation for the vertical edge surface over the whole thickness of the semiconductor substrate.

For example, a coefficient of thermal expansion of the glass structure 110 might differ by less than 30% (or less than 25%, less than 20%, less than 15%, less than 10%, less than 5% of a coefficient of thermal expansion of the wide band-gap semiconductor substrate 102) from the coefficient of thermal expansion of the wide band-gap semiconductor substrate 102. Using materials with similar coefficient of thermal expansion may reduce the mechanical stress within the semiconductor device.

More details and aspects of the semiconductor device 1100 are mentioned in connection with the proposed concept or one or more examples described above or below (e.g. FIG. 1-10, 12). The method may comprise one or more additional optional features corresponding to one or more aspects of the proposed concept or one or more examples described above or below.

Figure 12:
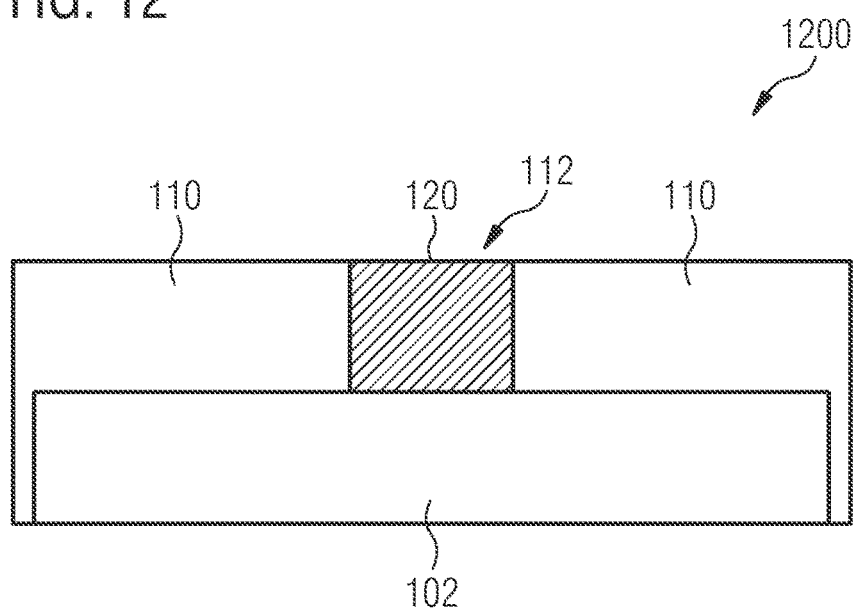
FIG. 12 illustrates a schematic cross section of a semiconductor device.

FIG. 12 illustrates a schematic cross section of a semiconductor device 1200 comprising a semiconductor substrate 102. The semiconductor device further comprises a glass structure 110 attached to the semiconductor substrate 102. The glass structure comprises at least one opening 112 extending through the glass structure comprising at least one pad structure 120 electrically connected to at least one doping region of the semiconductor substrate 102. The glass structure 110 is in contact with a vertical edge surface of the semiconductor substrate 102. For example, the glass structure 110 may be in contact with the vertical edge surface of the semiconductor substrate 102 over the whole thickness of the semiconductor substrate 102. The semiconductor substrate 102 may correspond to a silicon (Si) semiconductor substrate or to a wide band-gap semiconductor substrate, for example.

Using a glass structure as passivation may enable to improve the protection of the semiconductor devices against external influences. Further, a thick power metallization or pad metallization may be enabled by using a glass structure with openings for pad structures. Additionally, the robustness of semiconductor devices may be improved by using a glass structure as passivation, since the glass structure may also implement a robust carrier.

For example, a coefficient of thermal expansion of the glass structure 110 might differ by less than 30% (or less than 25%, less than 20%, less than 15%, less than 10%, less than 5% of a coefficient of thermal expansion of the semiconductor substrate 102) from the coefficient of thermal expansion of the semiconductor substrate 102. Using materials with similar coefficient of thermal expansion may reduce the mechanical stress within the semiconductor device.

More details and aspects of the semiconductor device 1200 are mentioned in connection with the proposed concept or one or more examples described above or below (e.g. FIGS. 1-11). The method may comprise one or more additional optional features corresponding to one or more aspects of the proposed concept or one or more examples described above or below.

Embodiments may provide a method for manufacturing of a silicon carbide/glass composite system for power devices. The object of at least some embodiments may be the manufacturing of a composite system comprising a glass and an electrically functional device on SiC basis. In addition to the mechanically stabilizing effect of the glass and the directly related compatibility with today's thin-wafer technology, a hermetic passivation of the device may be additionally generated as a protection against environmental influences.

Embodiments may provide a method which may enable metal layers of any thickness, which may be (only) limited by the height (here: glass thickness) of the composite system.

Embodiments may provide a technology-compatible composite carrier (or girder) concept. In this respect, a glass used as the base material may offers improvements not only in terms of its mechanical characteristics but also in terms of its temperature stability. While, in the manufacture of semiconductor devices, the mechanical stability of a thinned wafer may, in most cases, today be ensured by using a temporary reversible carrier (e.g. using an acrylic adhesive), the carrier may be irreversibly connected to the device in the present invention. This may facilitate both thinning the wafer to far less than 40 µm and temperature steps>=300° C. After completion of the device, the glass (structure) may also serve as a hermetic surface passivation and thus protect the integrated circuit against external environmental influences (e.g., moisture) in operational condition.

To generate the composite system, two methods may be used, for example:

Generation of a permanent, planar connection between glass and silicon carbide (SiC) using an anodic bonding method. Furthermore, anodic bonding may be used in the depth; and Generation of a permanent, planar and/or three-dimensional connection between glass and SiC using a glass-pressing technique (hot embossing).

An aspect of the anodic connecting concept may be that already pre-patterned glass substrates may be used. This may provide flexibility in the processing of the final device while simultaneously reducing the process complexity.

Another aspect of the above-mentioned glass-pressing technique may be the generation of a three-dimensional composite system. Here, glass may be backfilled into already pre-fabricated trenches in a form-fitting manner. The trenches may be preferably provided in the area of the kerf, where the chips are separated at a later stage by sawing or lasering. In doing so, the depth of the trenches might preferably not be any larger than the thickness of the drift zone to ensure that the edge protection is ensured for this area, for example. This may enable generating chipping-free devices while simultaneously sealing the sidewalls of the chips. Further, the buried glass layer may serve as an end stop signal and/or as a stop signal when processing the backside (BS).

Other aspects in using glass may be:

Low thermomechanical load as the CTE for glass may be adapted to SiC;

High thermal, mechanical and chemical stability (almost inert);

High reliability (resistant to ageing);

No loss in volume (no shrinking);

Good insulation and breakdown strength including low moisture absorption (no fractures/breaks by "popcorn effect" due to moisture during soldering/in operation);

High transparency→easily adjustable FS/BS lithographic processes;

Unlike ceramic substrates, glass can be processed in a more cost-effective and easier manner;

A number of structuring possibilities (grinding, etching, sawing, milling, drilling, embossing, sandblasting, ultrasound (US) hammering, . . . );

Unevenness on planar glass surfaces may be removed by mechanical and/or chemical methods;

Material requirements may be variable due to composition and process parameters;

Very thick power metallization may be feasible (>>20 µm); and

Scalable for all product classes and sizes.

A basic point of at least some embodiments may be a generation of an irreversible composite system of a device on SiC basis with a glass carrier and "bond similar" methods at wafer level. Two different process variants may be suggested for this. In addition to a planar connection between glass and system wafer, a three-dimensional carrier (or girder) system may also be possible.

For example, a method for forming of semiconductor devices may be based on:

Use of microelectromechanical systems (MEMS) (processes (connecting methods) for realization of a composite system for high-voltage applications;

Realization of an hermetic passivation having very good barrier characteristics against moisture (corrosion);

Realization of very thick power metallizations;

Realization of chipping-free devices; and

Further reduction in modern limit thickness in a SiC thin-wafer process from 300 µm to a few µm (depending on the voltage class). Micro fractures during grinding may be suppressed by the massive glass layer on the front side.

An exemplary method for forming of semiconductor devices may be hereinafter explained in more detail using the manufacture of a SiC-based diode (merged pn-Schottky diode). Other SiC-based devices may also be conceivable. (e.g., SiC MOSFET with another process integration scheme. Moreover, due to non-planar surfaces, anodic bonding might not be an option). Figures (e.g. FIGS. 2-10) may serve to illustrate the basic principle of examples and might only show the device structures and/or method steps required to understand this basic principle. Structures illustrated in the graphics are not necessarily scaled to size. P-wells to be contacted in the figures may be located in the area of the glass openings. In devices with several pads on the front side (e.g., switch with a gate terminal), several openings isolated from one another by a glass fin may be comprised in the glass structure for each semiconductor device. The position of the structured openings in the glass may be selected such that all areas to be electrically contacted are comprised.

The procedure may start with a non-thinned SiC substrate of which the front side has already run through all high-temperature processes required for the device (epitaxy, implantation and subsequent post-implant annealing, contacting if necessary). Optionally, the SiC substrate might already be patterned from the front side. Trench structures (pre-cut) in the sawing frame (kerf) of the wafer may simplify the separation process into individual chips, which may be a part of the method (e.g. at the end). Sawing the SiC might not be required after the thin grinding (e.g. FIG. 9a). This process variant may enable an implementation of chipping-free devices. Subsequently, an irreversible composite system between glass and SiC substrate may be realized. The connection may be generated using different methods described in more detail below.

For example, a composite system may be realized using an anodic bonding method. In addition to the use of unpatterned glass substrates (not drawn), an aspect of the anodic bonding concept is that already pre-patterned glass substrates may be used (e.g. FIGS. 3a-3b). This may provide flexibility in processing the device while simultaneously reducing the process complexity.

Methods for full-surface or local glass structuring (e.g. for forming of at least one opening) may be wet chemical or plasma-supported etching methods as well as sawing- or laser-supported processes.

With the exception of sawing- and laser-supported processes, this method may require a hard mask for selective material dissolution of unprotected areas and structure profiles specified by the process/determining structure profiles (isotropic profile in wet chemical methods, anisotropic profile in plasma, sawing or laser methods).

A maskless structuring might be carried out using photopatternable glass types (e.g., Foturan, by Schott corporation), the solubility of the glass may be modified in a 10% hydrofluoric acid (HF) solution using suitable light exposure. Alternatively, unconventional methods, e.g., sand blasting or ultrasound (US) hammering, are also conceivable for patterning glass substrates.

Another approach to generate full-surface glass structures at wafer level may be the so-called hot embossing. Predefined structures may be embossed into a glass heated up close to the yield point (e.g. to a glass transition temperature, FIG. 6a-6c). Thus, three-dimensional structures having strictly defined thread angles (e.g. also less than 90°) may be generated. In this respect, the requirements set out for the glass material to be pressed may be varied due to the material composition and further process parameters, such as temperature and pressure. After a connection between SiC and glass has been realized, the glass may serve as a mechanically stable carrier for backside processes or might directly be opened with the help of grinding methods (FIG. 9a).

The course of the further process steps such as thinning, metallization, planarization and separation of the composite system might be the same in both composite system variants.

The variant of the glass-pressing technique may enable to fully backfill trench structures existing in the SiC substrate and to realize an additional passivation of the side walls of the chips.

A further variant to irreversibly connect SiC and glass (for a realization of a composite system using a glass pressing technique) is the so-called hot embossing, wherein glass may be brought close to its corresponding yield point (e.g. its glass transition temperature) and, under pressure, may be pressed on the respective SiC base substrate. Due to the rather high transformation temperatures of typical glass types adapted to the coefficient of thermal expansion (CTE) of SiC, pre-structuring of the glass may be omitted to avoid possible change in structural geometry of the openings.

This pressing process may enable that trench structures already predefined in the SiC substrates (here: in the kerf) may be completely backfilled with glass. In addition, this may allow for a generation of a passivation of the sidewalls of the chips, which may protect the device against external environmental influences after the chip separation (e.g. FIG. 9b).

After realizing the (irreversible) connection between the SiC wafer and the glass, the wafer may, depending on the technology category, be thinned to the wanted thickness using typical grinding methods. Alternatively, the so-called "cold-split" methods may be suitable in case of this technology, wherein very accurately defined layer thicknesses may be split off from the basic substrate. An aspect of this method may be that the SiC base substrate might be recycled, something that, in turn, reduces the technological costs from an economic point of view.

Instead of conventional substrates, SiC wafer templates might also be used (for a separation of a plurality of semiconductor devices comprised in the wide band-gap semiconductor wafer), wherein thin, monocrystalline SiC layers may be transferred to high-temperature resistant cheap auxiliary wafers using smart cut and wafer bonding (e.g., poly SiC or carbon carrier). Particularly in case of the carbon carrier, targeted thinning onto the SiC layer may easily be performed after depositing the glass layer (chemically selective, e.g., by $O_2$ plasma ashing, or physically selective due to the very large differences in hardness).

Then, the glass substrate (glass structure) may be structured using standardized wet-chemical etching processes. Depositing and structuring a poly Si hard mask using photoresist and lithography may be used for this.

Due to the high-temperature compatibility of the SiC devices, the glass structuring might alternatively be realized in a maskless manner as well, e.g. using the hot embossing technique. Here, the composite system might be repeatedly heated up close to the temperature where the glass flows. A stamp structured accordingly for the opening generates the respective openings under pressure and under the influence of temperature. The remaining glass above the contact pads may be removed using a short wet-chemical etching step (HF) (e.g. FIG. 6a-6c).

Optionally, the structuring of the glass substrate can might also take place prior to the thinning process.

To realize thick, large-surface power metallizations, two variants may be suitable in addition to the classical coating or sputter deposition:

Printing of relevant metal pastes

ECD (electrochemical deposition, electroplating)

If ECD is selected for deposition of the power metallization, the Schottky metallization may be used as a seed layer for the electrical contact in electroplating. To enable simultaneous metal growth on all pads, the glass may be structured (e.g. FIGS. 7a-7d) such that all chips are contacted over an outer ring.

To optionally prevent metal growth on the glass, the seed layer (here: Schottky metallization) may be removed on the surface using a polishing or grinding process. A connection of the individual pads may comprise a metallization in deeper trenches in the glass, e.g., along saw lines and short terminal pieces to the pad. This connection may be removed after the plating (electrochemical deposition), e.g. using a second grinding process.

When using screen printing to backfill openings comprise in the glass structure, due to different fillers and solvents in the pastes, a misalignment may result in respective openings after curing of the metallization. This misalignment may be taken into account when selecting the thickness of the remaining glass substrate (provision) as full planarization is hereby possible.

Then, the planarization may be performed using well-established grinding processes. Glass and metal may both be grinded here at the same time. In contrast to the standardized pattern plating, the thickness of the power metallization might not be limited to 20 μm, but might be determined solely by the glass thickness so that very thick metallizations (20 . . . 450μ,) may be feasible as well.

Furthermore, a deposition of the backside metallization may take place (e.g. FIGS. 9b and 9c) which, as an option, might already be performed prior to the realization of the front side metallization (e.g. forming of electrically conductive material within at least one opening of a glass structure). While thin metallizations may be feasible using standardized PVD methods, thick power metallizations may be be generated, repeatedly using ECD or printing methods.

If the prefabricated trenches in the SiC substrate are completely filled with glass, following the separation performed using typical dry etching, sawing- or laser-supported methods, a hermetic sidewall passivation may result, which may (perfectly) protect the device against external environmental influences.

Optionally, after the thinning process, it may be possible to implement suitable carrier structures on the backside. The deposition of a very thick power metallization may also be possible on the backside, e.g. without having to perform dicing in the preassembly through a very thick power metallization. The thick power metallization on the chips backside (e.g. shown in FIG. 9c) may preferably comprise a finishing layer capable of sintering (Nickel/Silver) or capable of diffusion soldering (Gold tin (AuSn)), Mo, Cu, NiMoP, etc.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming semiconductor devices, the method comprising:
   attaching a glass structure to a wide band-gap semiconductor wafer comprising a plurality of semiconductor devices, such that the glass structure is stacked on a front-side or back-side surface of the wide band-gap semiconductor wafer without the wide band-gap semiconductor wafer being integrated within the glass structure; and
   forming at least one pad structure electrically connected to at least one doping region of a semiconductor substrate of the wide band-gap semiconductor wafer, by forming electrically conductive material within at least one opening extending through the glass structure,
   wherein the glass structure is in contact with a vertical edge surface of the semiconductor substrate.

2. The method of claim 1, wherein attaching the glass structure to the wide band-gap semiconductor wafer comprises heating the glass structure to a glass-transition temperature of the glass structure and exerting pressure on at least a part of the glass structure.

3. The method of claim 1, wherein attaching the glass structure to the wide band-gap semiconductor wafer comprises anodic bonding of the glass structure to the wide band-gap semiconductor wafer.

4. The method of claim 1, further comprising forming at least one trench structure extending into the wide band-gap semiconductor wafer between neighboring semiconductor devices of the plurality of semiconductor devices.

5. The method of claim 4, wherein the plurality of semiconductor devices each comprise a semiconductor substrate and a glass sub-structure, the method further comprising cutting the wide band-gap semiconductor wafer along the at least one trench structure to separate the plurality of semiconductor devices, wherein the glass sub-structure is in contact with the vertical edge surface of the semiconductor substrate after the cutting of the wide band-gap semiconductor wafer.

6. The method of claim 1, further comprising forming the least one opening of the glass structure after attaching the glass structure to the wide band-gap semiconductor wafer.

7. The method of claim 6, wherein forming the at least one opening comprises grinding a portion of the glass structure to expose at least one recess in the glass structure.

8. The method of claim 6, wherein forming the at least one opening comprises etching at least a portion of the glass structure to obtain at least a portion of the at least one opening.

9. The method of claim 6, wherein forming the at least one opening comprises heating the glass structure to a glass-transition temperature of the glass structure and exerting pressure on at least a part of the glass structure with an embossing pattern.

10. The method of claim 1, wherein the electrically conductive material of the at least one pad structure has a thickness larger than 5 µm.

11. The method of claim 1, wherein the plurality of semiconductor devices comprises a plurality of pad structures electrically connected to a plurality of doping regions of a plurality of semiconductor substrates of the plurality of semiconductor devices, wherein the plurality of pad structures are formed by forming the electrically conductive material within a plurality of openings of the glass structure, and wherein forming the electrically conductive material comprises forming an electrical connection between the plurality of pad structures.

12. The method of claim 11, further comprising removing the at least one electrical connection between the plurality of pad structures after forming the plurality of pad structures.

13. The method of claim 11, wherein at least portions of the electrical connection between the plurality of pad structures are located within a trench structure extending into the glass structure, the method further comprising grinding a portion of the glass structure to electrically disconnect the plurality of pad structures.

14. The method of claim 1, wherein forming the electrically conductive material comprises at least partially filling the at least one opening with an electrically conductive paste.

15. The method of claim 1, further comprising attaching a further glass structure to a backside of the wide band-gap semiconductor wafer and forming at least one electrically conductive structure electrically connected to a backside of the semiconductor substrate by forming electrically conductive material within at least one opening extending through the further glass structure.

16. The method of claim 1, further comprising separating the plurality of semiconductor devices by cutting only through electrically insulating material.

17. The method of claim 1, wherein the glass structure comprises at least one of a borosilicate glass, a soda-lime glass, a float glass, a quartz glass, a porcelain, a polymer thermoplastic, a polymer glass, an acrylic glass, polycarbonate, polyethylene terephthalate, an undoped silica, a doped silica, a polynorbornene, polystyrene, a polycarbonate, a polyimide, a benzocyclobutene, and a parylene.

18. A composite system, comprising:
   a wide band-gap semiconductor wafer comprising a plurality of semiconductor devices;
   a glass structure attached to the wide band-gap semiconductor wafer such that the glass structure is stacked on a front-side or back-side surface of the wide band-gap semiconductor wafer without the wide band-gap semiconductor wafer being integrated within the glass structure; and
   at least one pad structure electrically connected to at least one doping region of a semiconductor substrate of the wide band-gap semiconductor wafer, the at least one pad structure including electrically conductive material within at least one opening extending through the glass structure,
   wherein the glass structure is in contact with a vertical edge surface of the semiconductor substrate.

19. The composite system of claim 18, wherein at least one trench structure extends into the wide band-gap semiconductor wafer between neighboring semiconductor devices of the plurality of semiconductor devices.

20. The composite system of claim 18, further comprising:

a further glass structure attached to a backside of the wide band-gap semiconductor wafer; and
at least one electrically conductive structure electrically connected to a backside of the semiconductor substrate, the at least one electrically conductive structure including electrically conductive material within at least one opening extending through the further glass structure.

\* \* \* \* \*

UNITED STATES PATENT AND TRADEMARK OFFICE
CERTIFICATE OF CORRECTION

PATENT NO. : 11,393,784 B2
APPLICATION NO. : 15/690517
DATED : July 19, 2022
INVENTOR(S) : R. Rupp et al.

It is certified that error appears in the above-identified patent and that said Letters Patent is hereby corrected as shown below:

In the Claims

Column 23, Line 54 (Claim 6), please change "least" to -- at least --.

Signed and Sealed this
Twentieth Day of September, 2022

*Katherine Kelly Vidal*
*Director of the United States Patent and Trademark Office*